(12) United States Patent
Kim

(10) Patent No.: US 8,283,186 B2
(45) Date of Patent: Oct. 9, 2012

(54) MAGNETIC MEMORY DEVICE AND METHOD FOR MANUFACTURING THE SAME

(75) Inventor: Hyun Jeong Kim, Gyeonggi-do (KR)

(73) Assignees: Hynix Semiconductor Inc., Icheon-Si (KR); Grandis, Inc., Milpitas, CA (US)

( * ) Notice: Subject to any disclaimer, the term of this patent is extended or adjusted under 35 U.S.C. 154(b) by 0 days.

(21) Appl. No.: 13/476,963

(22) Filed: May 21, 2012

(65) Prior Publication Data

US 2012/0228685 A1 Sep. 13, 2012

Related U.S. Application Data

(62) Division of application No. 12/494,245, filed on Jun. 29, 2009, now Pat. No. 8,202,737.

(30) Foreign Application Priority Data

Jul. 7, 2008 (KR) .................. 10-2008-0065484

(51) Int. Cl.
*H01L 29/82* (2006.01)

(52) U.S. Cl. ............ 438/3; 257/421; 257/427; 365/157; 365/158; 360/324; 360/324.2

(58) Field of Classification Search .......... 257/421–427; 438/3; 360/324–326; 365/157–158, 171–173
See application file for complete search history.

(56) References Cited

U.S. PATENT DOCUMENTS

2008/0175041 A1* 7/2008 Aoki ............................ 365/158
* cited by examiner

*Primary Examiner* — Jami M Valentine (57) ABSTRACT

A magnetic memory device and a method for manufacturing the same are disclosed. The magnetic memory device includes a plurality of gates formed on a semiconductor substrate, a source line connected to a source/drain region shared between the gates neighboring with each other, a plurality of magnetic tunnel junctions connected to non-sharing source/drain regions of the gates on a one-to-one basis, and a bit line connected to the magnetic tunnel junctions. The magnetic memory device applies a magnetic memory cell to a memory so as to manufacture a higher-integration magnetic memory, and uses the magnetic memory cell based on a transistor of a DRAM cell, resulting in an increase in the availability of the magnetic memory.

12 Claims, 7 Drawing Sheets

MAGNETIC MEMORY DEVICE AND METHOD FOR MANUFACTURING THE SAME

CROSS-REFERENCE TO RELATED APPLICATION

The priority of Korean patent application No. 10-2008-0065484 filed on Jul. 7, 2008, the disclosure of which is hereby incorporated in its entirety by reference, is claimed.

BACKGROUND OF THE INVENTION

The present invention relates to a magnetic memory device and a method for manufacturing the same.

In recent times, a variety of memories have been widely used throughout the world, in particular, dynamic RAMs (DRAMs) have the largest circulation market in association with such memories. A DRAM is a representative memory device in which one MOS transistor and one capacitor create a pair used to store one bit. This DRAM is a volatile memory device, which stores data as an electric charge in a capacitor. This requires a periodic refresh operation so as not to lose stored data.

In contrast to the above DRAM, a NAND/NOR flash memory is used as a non-volatile memory like a hard disc drive (HDD), which does not lose stored data even when power is turned off. Particularly, the NAND flash memory has the highest degree of integration among commercial flash memories. A device using the flash memory can be designed smaller and lighter than ones using a HDD. In addition, the flash memory has very strong resistance to a physical impact, has a very fast access speed, and consumes a small amount of power, so that it is generally used as a storage medium for mobile products. However, the flash memory has slower speeds and a higher operation voltage as compared to the DRAM.

In recent times, many people and companies are conducting intensive research into a method for manufacturing an improved memory having the advantages of both the flash memory and the DRAM, and allowing the improved memory to be commercially available. Representative examples of the improved memory are a phase change RAM (PCRAM), a magnetic RAM (MRAM), a polymer RAM (PoRAM), a resistive RAM (ReRAM), and the like.

Specifically, the MRAM is designed to use a resistance variation caused by a polarity variation of a magnetic body as a data storage method. Some low-capacity MRAM products among MRAMs have already been commercially manufactured and introduced to the market. Furthermore, the MRAM is a memory based on magnetism, so that it is not damaged even by radioactivity from space. As a result, it is considered that the MRAM has been considered the safest and most stable among memories above.

Figure 1:
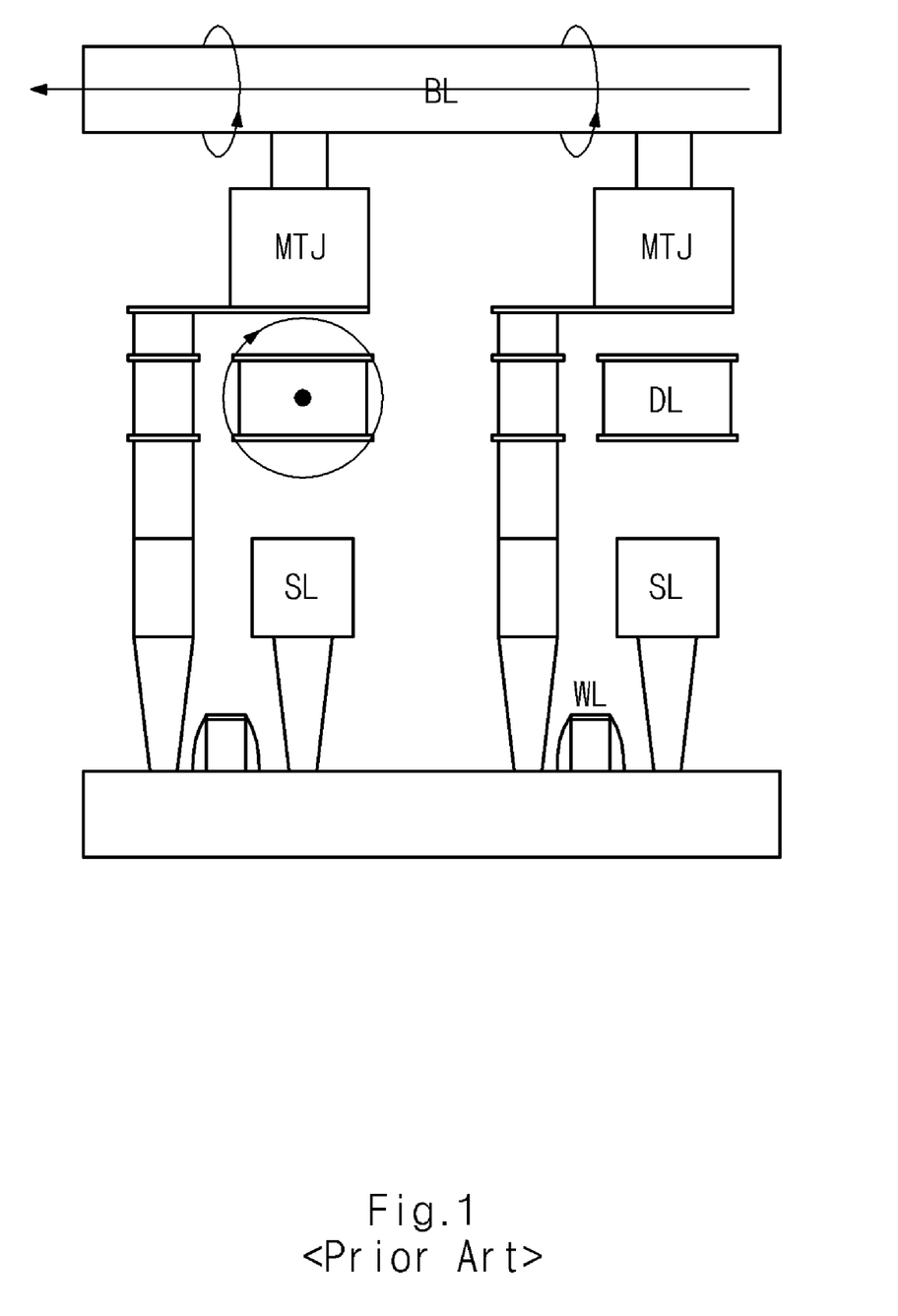
FIG. 1 is a cross-sectional view illustrating a conventional MRAM structure.

FIG. 1 is a cross-sectional view illustrating a conventional MRAM structure.

A write operation of the MRAM is carried out by the vector sum of two magnetic fields from two currents simultaneously flowing in a bit line (BL) and a digit line (DL). The first magnetic field is generated by the current flowing through bit line (BL) and the second magnetic field is generated by the current flowing through digit line (DL).

In other words, the conventional MRAM illustrated in FIG. 1 must include not only a bit line but also a digit line. As a result, the conventional MRAM cell increases in size, such that the cell efficiency is deteriorated as compared to other memories.

The MRAM has another disadvantage in that a half-selection status may occur in a process for selecting a cell and writing data to that selected cell. This can cause unselected cells sharing the digit line (DL) or the bit line (BL) to be exposed to a magnetic field generated from a corresponding line due to the occurrence of the half-selection status. In this case, a disturbance in which a status of unselected cell is inverted may occur during a write operation.

Accordingly, a smaller-sized MRAM that does not need to use the digit line (DL) has recently been developed, and a spin transfer torque (STT)—magnetic RAM (MRAM) capable of preventing a disturbance caused by the half-selection status in a write operation is being developed. In more detail, if a spin transfer torque (STT) phenomenon occurs in a ferromagnetic body (i.e., if a high-density current signal is incident to a ferromagnetic body) and a magnetization direction of the ferromagnetic body does not coincide with a spin direction of the current signal, a magnetization direction of the ferromagnetic body is aligned with the spin direction of the current signal. This phenomenon is called a STT phenomenon, such that the STT-MRAM is designed using characteristics of the STT phenomenon.

BRIEF SUMMARY OF THE INVENTION

Various embodiments of the present invention are directed to providing a magnetic memory device and a method for manufacturing the same that substantially obviate one or more problems due to limitations and disadvantages of the related art.

An object of the present invention is to provide a magnetic memory device and a method for manufacturing the same, in which a STT—magnetic RAM (MRAM) cell is formed on the basis of a transistor of a DRAM cell, so that the availability of the STT-MRAM is greatly increased and the integration degree of the STT-MRAM is also increased.

In accordance with an aspect of the present invention, a spin transfer torque (STT)—magnetic random access memory (MRAM) device includes: first and second gates formed over a semiconductor substrate, the first and second gates being adjacent to each other; a source line connected to a source/drain region shared by the first and second gates; a magnetic tunnel junction (MTJ) connected to a source/drain region provided adjacent to the first gate and not shared by the first and second gates; and a bit line electrically coupled to the MTJ.

Preferably, the source line may be formed perpendicular to a long axis of an active region.

Preferably, the STT-MRAM device may further include: a first interlayer insulating layer for isolating the gates from the first and second source line, and including a source line contact for connecting the source line to a landing plug contact of the shared source/drain region.

Preferably, the first interlayer insulating layer may further include a first bottom electrode contact connected to a landing plug contact of the non-sharing source/drain region.

Preferably, the STT-MRAM device may further include: a second interlayer insulating layer for isolating the source line from the MTJ, and including a second bottom electrode contact for connecting the first bottom electrode contact to the MTJ.

Preferably, the second interlayer insulating layer may further include: a metal layer to connect the first bottom electrode contact to the second bottom electrode contact. In this case, the first bottom electrode contact and the second bottom electrode contact may be integrated in one body through one etching process.

Preferably, each of the MTJ may be formed in the shape of a square or oval having an aspect ratio (width-length ratio) of 1:1~1:5. Preferably, the MTJ may be horizontally symmetrical to each other with respect to the source line. Preferably, each of the magnetic tunnel junctions (MTJs) may have an aspect ratio of 1:2. Preferably, at least some of MTJ may be arranged in a zigzag manner along a source line direction so as to overlap with the source line. Preferably, each of the MTJ may have an aspect ratio of 1:3.

Preferably, the STT-MRAM device may further include: a metal layer formed between a landing plug contact of the non-sharing source/drain region and the MTJ.

In accordance with another aspect of the present invention, a method for manufacturing a spin transfer torque (STT)—magnetic random access memory (MRAM) device includes: forming first and second gates over a semiconductor substrate, the first and second gates being provided adjacent to each other; forming a source line electrically coupled to a source/drain region shared by the first and second gates; forming a magnetic tunnel junction (MTJ) electrically coupled to a source/drain provided adjacent to the first gate and not shared by the first and second gates; and forming a bit line electrically coupled to the MTJ.

Preferably, the forming of the source line may include: forming a landing plug contact between the first and second gates; forming a first interlayer insulating layer over the first and second gates and the landing plug contact; forming a source line contact by selectively etching the first interlayer insulating layer; and forming a metal layer over the first interlayer insulating layer and the source line contact, patterning the metal layer and patterning the metal layer.

Preferably, the forming of the source line contact may include: selectively etching the first interlayer insulating layer until the landing plug contact of the shared source/drain region is etched to a predetermined depth, so as to form a source line contact hole; forming a conductive layer to fill the source line contact hole; and planarizing the conductive layer by removing the conductive layer until the first interlayer insulating layer is exposed.

Preferably, the forming of the MTJ electrically coupled to the non-sharing source/drain region of the first and second gates may include: forming a second interlayer insulating layer over the source line and the first interlayer insulating layer; forming a bottom electrode contact by selectively etching the second interlayer insulating layer and the first interlayer insulating layer; sequentially forming a pinned ferromagnetic layer, a tunnel junction layer, and a free ferromagnetic layer over the second interlayer insulating layer and the bottom electrode contact; and patterning the pinned ferromagnetic layer, the tunnel junction layer, and the free ferromagnetic layer.

Preferably, the forming of the bottom electrode contact may include: forming a bottom electrode contact hole by selectively etching the second interlayer insulating layer and the first interlayer insulating layer until a landing plug contact of a non-sharing source/drain region is etched to a predetermined depth; forming a conductive layer to bury the bottom electrode contact hole; and planarizing the conductive layer by etching the conductive layer until the second interlayer insulating layer is exposed.

Preferably, the forming of the MTJ electrically coupled to the non-sharing source/drain region of the first and second gates may include: forming a first bottom electrode contact by selectively etching the first interlayer insulating layer; forming the second interlayer insulating layer on the first bottom electrode contact, the source line, and the first interlayer insulating layer; forming a second bottom electrode contact by selectively etching the second interlayer insulating layer until the first bottom electrode contact is exposed; sequentially forming a pinned ferromagnetic layer, a tunnel junction layer, and a free ferromagnetic layer on the second interlayer insulating layer and the second bottom electrode contact; and patterning the pinned ferromagnetic layer, the tunnel junction layer, and the free ferromagnetic layer.

Preferably, the forming of the MTJ electrically coupled to the non-sharing source/drain region of the first and second gates may include: forming a first bottom electrode contact by selectively etching the first interlayer insulating layer; forming an interlayer metal layer on the first bottom electrode contact; forming a second interlayer insulating layer on the interlayer metal layer, the first bottom electrode contact, the source line, and the first interlayer insulating layer; forming a second bottom electrode contact by selectively etching the second interlayer insulating layer until the interlayer metal layer is exposed; sequentially forming a pinned ferromagnetic layer, a tunnel junction layer, and a free ferromagnetic layer on the second interlayer insulating layer and the second bottom electrode contact; and patterning the pinned ferromagnetic layer, the tunnel junction layer, and the free ferromagnetic layer.

Preferably, the method may further include: forming a metal layer between each of the non-sharing source/drain regions and each of the magnetic tunnel junctions (MTJs), wherein the metal layer may be connected to each of the non-sharing source/drain regions and each of the MTJs.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 2:
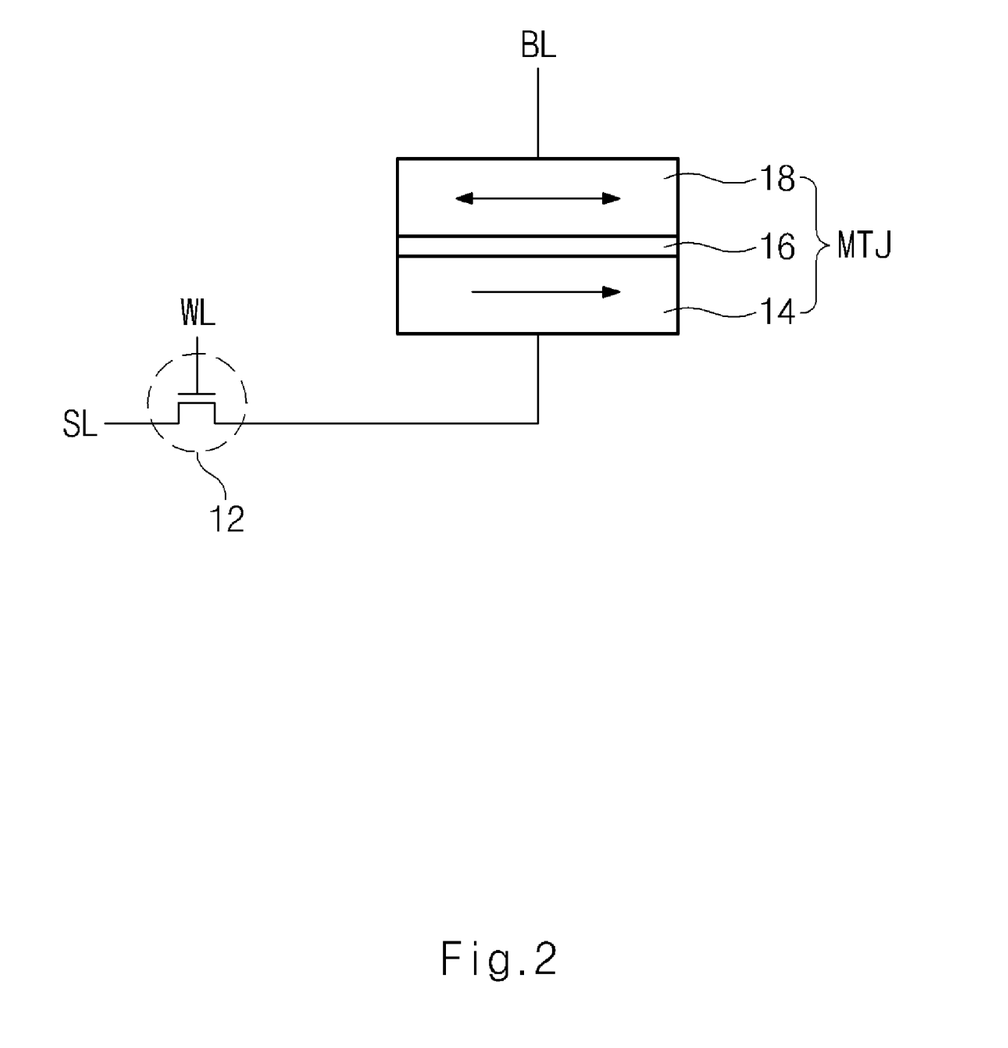
FIG. 2 is a circuit diagram illustrating a basic unit cell of a STT-MRAM according to the present invention.

FIG. 2 is a circuit diagram illustrating a basic unit cell of a STT-MRAM according to the present invention. For convenience of description, the basic unit cell of the STT-MRAM is referred to as a MRAM cell.

The STT-MRAM cell includes one transistor 12 connected between two metal lines (i.e., a bit line BL and a source line SL) and one magnetic tunnel junction (MTJ).

The transistor 12 is connected between the source line (SL) and the MTJ, and is turned on according to a voltage received through a word line (WL). When turned on, current flows between the source line (SL) and the bit line (BL) through the MTJ. The MTJ is connected between a source/drain region and a bit line (BL), and includes two magnetic layers 14 and 18 and a tunnel barrier layer 16 between the two magnetic layers 14 and 18. In this case, a lower layer of the tunnel barrier layer 16 includes a pinned ferromagnetic layer 14 having a pinned magnetization direction. Also, an upper layer of the tunnel barrier layer 16 includes a free ferromagnetic layer 18, a magnetization direction of which is changed according to the direction of a current signal applied to the MTJ.

In this case, if a current signal flows from the source line (SL) to the bit line (BL) (i.e., if a current signal flows from a pinned ferromagnetic layer 14 to a free ferromagnetic layer 18), a magnetization direction of the free ferromagnetic layer 18 is switched to be parallel to the magnetization direction of the pinned ferromagnetic layer. In other words, the MTJ is switched to a low-resistance status, so that data "0" is stored in a corresponding cell.

Otherwise, if a current signal flows from the bit line (BL) to the source line (SL) (i.e., if a current signal flows from the free ferromagnetic layer 18 to the pinned ferromagnetic layer 14), a magnetization direction of the free magnetization layer 18 is switched in anti-parallel to that of the pinned ferromagnetic layer 14. In other words, the MTJ is switched to a high-resistance status, so that data "1" is stored in a corresponding cell.

A method for reading data stored in the MTJ is implemented by a difference in capacity of a current signal flowing through the MTJ according to a changed MTJ magnetization status detected by the above-mentioned method.

Figure 3:
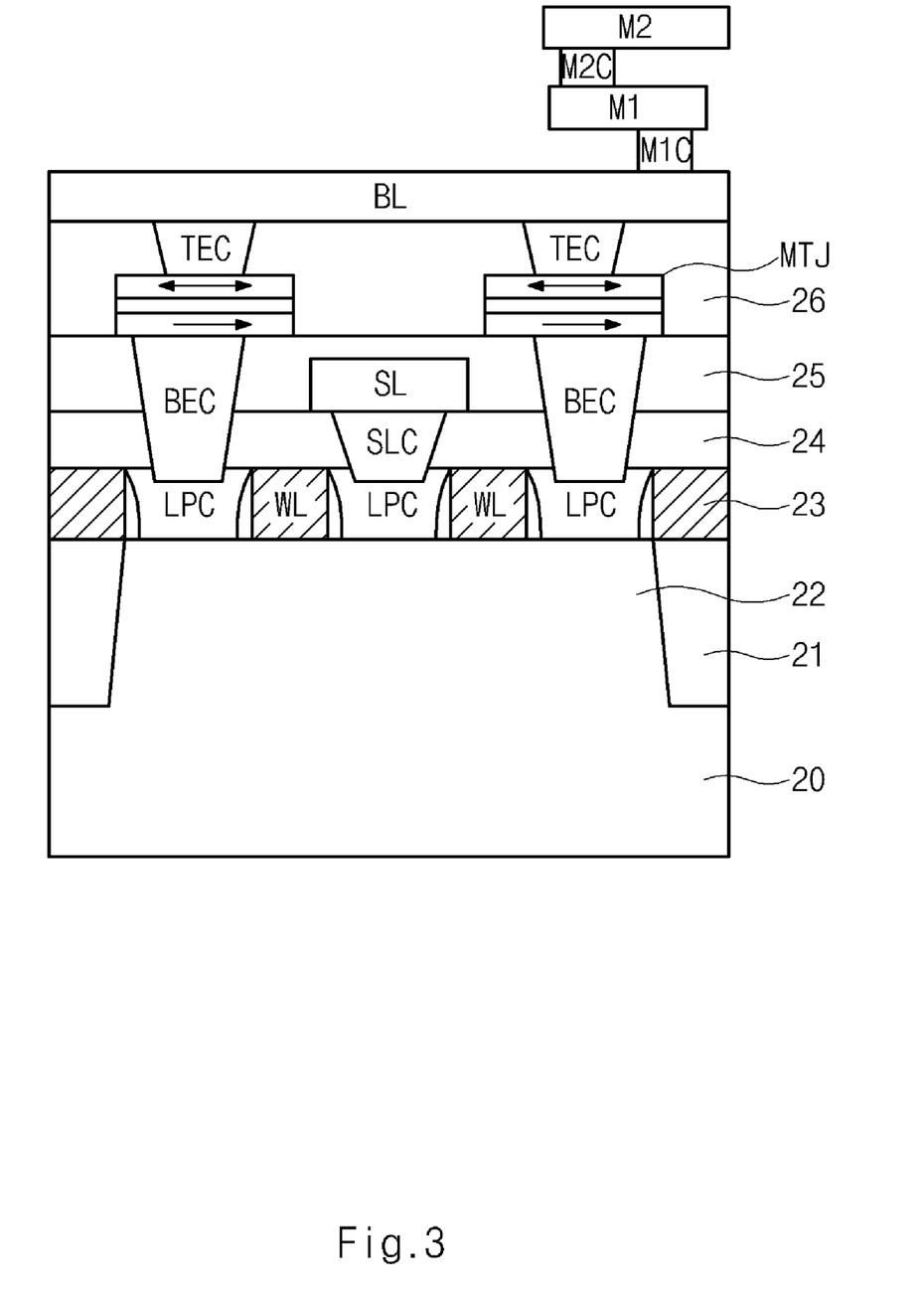
FIG. 3 is a cross-sectional view illustrating a STT-MRAM device according to a first embodiment to which the STT-MRAM cell of FIG. 2 is applied.

FIG. 3 is a cross-sectional view illustrating a STT-MRAM device according to a first embodiment to which the STT-MRAM cell of FIG. 2 is applied. The STT-MRAM according to the first embodiment of the present invention will hereinafter be described with reference to FIG. 3.

Referring to FIG. 3, a device isolation layer 21 (e.g., STI layer) for defining an active region 22 is formed on a semiconductor substrate 20. A gate 23 including a word line (WL) is formed on the active region 22 defined by the device isolation layer 21. A landing plug contact (LPC) is formed on a source/drain region formed at both sides of the gate 23.

A first interlayer insulating layer 24 including both a source line contact (SLC) and a bottom electrode contact (BEC) is formed on the landing plug contact (LPC) formed between gates 23. In this case, the source line contact (SLC) is formed on the landing plug contact (LPC) of the source/drain region shared between the gates 23. The bottom electrode contact (BEC) is formed on the landing plug contact (LPC) of a non-sharing source/drain region that is not shared between the gates 23.

A source line (SL) is formed on the source line contact (SLC). The source line (SL) is formed parallel to the word line (WL) on the landing plug contact (LPC), such that two word lines (WL) share one source line (SL).

A second interlayer insulating layer 25 including a bottom electrode contact (BEC) is formed on the source line (SL). In this case, a bottom electrode contact (BEC) formed on the first interlayer insulating layer 24 and a bottom electrode contact (BEC) formed in the second interlayer insulating layer 25 may be formed by sequentially etching the first interlayer insulating layer 24 and the second interlayer insulating layer 25 at the same time. Otherwise, a contact may be independently formed on each of the first interlayer insulating layer 24 and the second interlayer insulating layer 25, so that two contacts formed on the first and second interlayer insulating layers 24 and 25 may be connected to each other. In contrast, an interlayer metal layer (not shown) is formed on a bottom electrode contact (BEC) formed at the first interlayer insulating layer 24. The bottom electrode contact (BEC) formed on the first interlayer insulating layer 24 and another bottom electrode contact (BEC) formed on the second interlayer insulating layer 25 may be interconnected through this interlayer metal layer. The interlayer metal layer may be patterned simultaneously when the source line (SL) is formed.

A third interlayer insulating layer 26 including both the MTJ and a top electrode contact (TEC) is formed on the bottom electrode contact (BEC). The bit line (BL) is formed so that the bit line (BL) is connected to the top electrode contact (TEC).

A plurality of metal lines M1 and M2 and a plurality of metal lines contacts M1C and M2C are formed on the bit line (BL), so that the metal lines M1 and M2 and the metal line contacts M1C and M2C are electrically connected to components (e.g., a sense amplifier) of a peripheral circuit part (not shown).

FIGS. 4 to 9 are cross-sectional views illustrating a method for manufacturing the STT-MRAM device of FIG. 3 according to the present invention.

Figure 4:
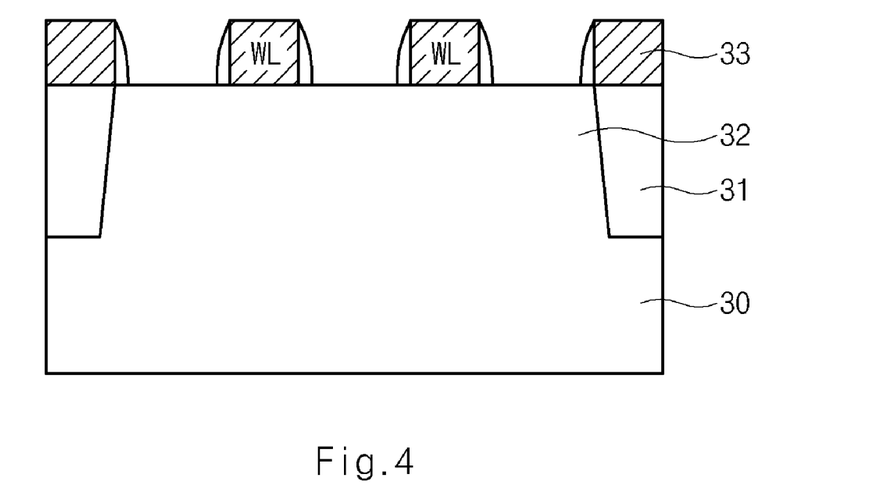
FIGS. 4 to 9 are cross-sectional views illustrating a method for manufacturing the STT-MRAM device of FIG. 3 according to the present invention.

Referring to FIG. 4, a device isolation layer 31 for defining an active region 32 using a shallow trench isolation (STI) process is formed on a silicon substrate 30. A gate electrode 33 including the word line (WL) is formed on the device isolation layer 31 and the active region 32. The gate electrode 33 may be formed in a laminated structure in which a gate oxide layer (not shown), a polysilicon layer (not shown), and a hard mask layer (not shown) are sequentially deposited.

Impurities are implanted in an exposed active region 32 located at both sides of the gate electrode 33, so that a source/drain region (not shown) is formed.

A method for forming the gate 33 and the source/drain region may be the same as that of a conventional DRAM.

Figure 5:
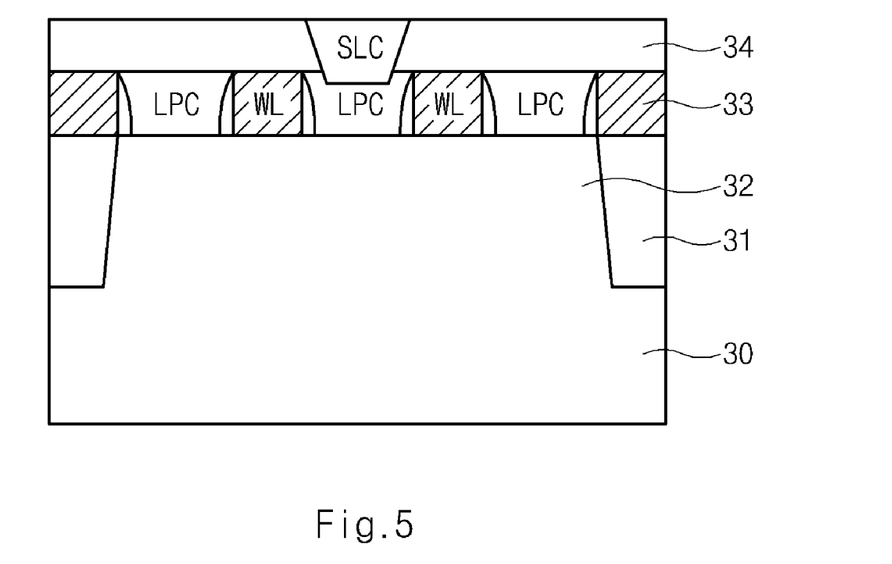

Referring to FIG. 5, a landing plug poly is formed on the resultant structure of FIG. 4 so as to fill a space between gates 33. The landing plug poly is CMP (Chemical Mechanical Polishing)—processed and planarized until a hard mask layer of the gate 33 is exposed, so that a landing plug contact (LPC) is formed.

A first interlayer insulating layer 34 is formed on the landing plug contact (LPC) and the gate, and is then planarized. The first interlayer insulating layer 34 is selectively etched until an upper part of the landing plug contact (LPC) is etched to a predetermined depth, so that a source line contact hole (not shown) is formed. Thereafter, a conductive layer for burying the source line contact hole is formed. The conductive layer is then etched until the first interlayer insulating layer 34 is exposed, so that a source line contact (SLC) is formed.

Figure 6:
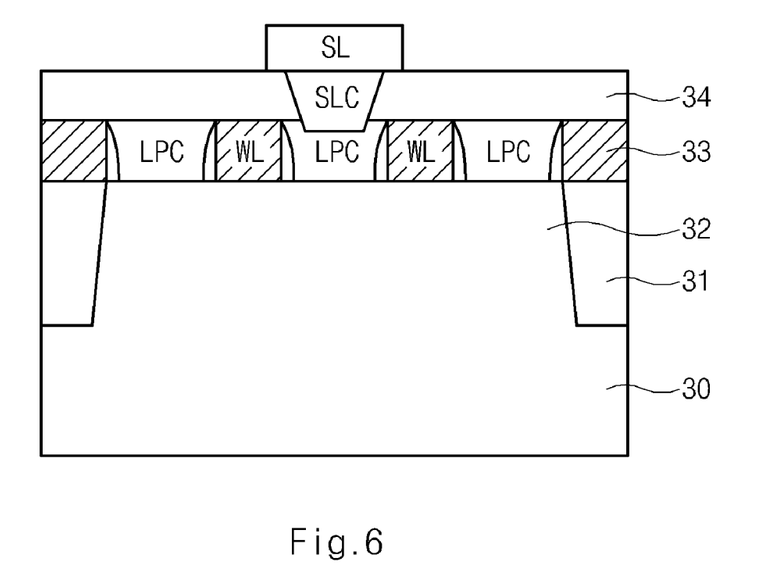

Referring to FIG. 6, a metal layer (not shown) is formed on the first interlayer insulating layer 34 including the source line contact (SLC). Subsequently, the metal layer is patterned using a mask (not shown) defining the source line (SL), so that a source line (SL) is formed.

In other words, the source line (SL) is formed in parallel to the gate, on the landing plug contact (LPC) located between two neighboring gates 33 in the active region 32.

Figure 7:
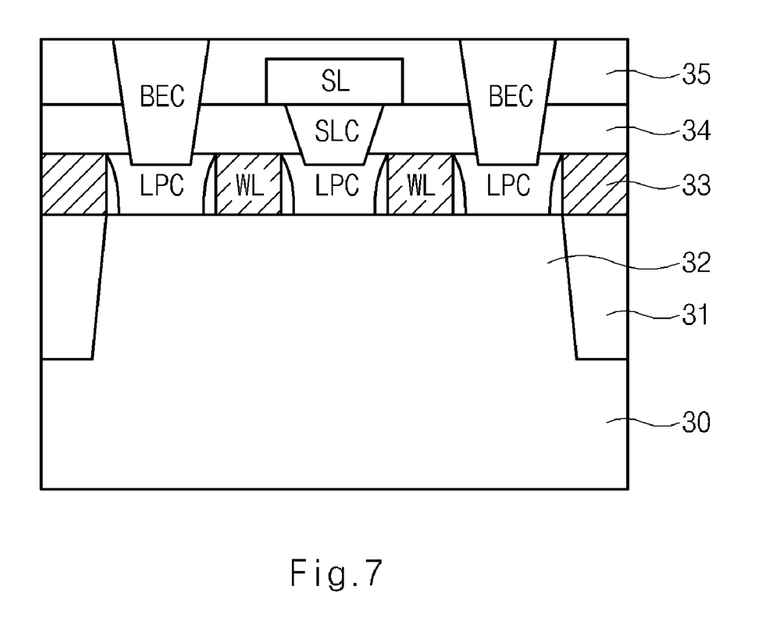

Referring to FIG. 7, a second interlayer insulating layer 35 is formed on the source line (SL) and the first interlayer insulating layer 34, and is then planarized. Subsequently, the second interlayer insulating layer 35 and the first interlayer insulating layer 34 are sequentially and selectively etched until the landing plug contact (LPC) is etched so that a bottom electrode contact hole (not shown) is formed. Only the landing plug contact (LPC) with no source line contact (SLC) in the source/drain region is etched and etched to a predetermined depth. Then, after a conductive layer is formed to fill the bottom electrode contact hole, the conductive layer is etched until the second interlayer insulating layer 35 is exposed, so that a bottom electrode contact (BEC) is formed.

Figure 8:
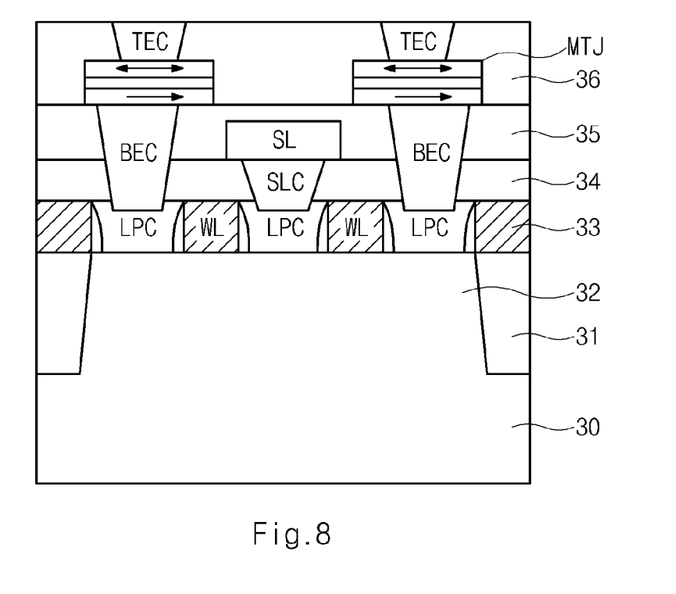

Referring to FIG. 8, a pinned ferromagnetic layer, a tunnel junction layer, and a free ferromagnetic layer are sequentially formed on the second interlayer insulating layer 35 including the bottom electrode contact (BEC). They are then patterned, so that a magnetic tunnel junction (MTJ) connected to the bottom electrode contact (BEC) is formed.

The MTJ is formed to have an aspect ratio of 1:1~1:5 so that it may have a desired spin direction. For example, if the MTJ is formed to have the length of 1 F in the word line (WL) direction, it may be formed to have the length of 1 F~5 F in the bit line (BL) direction, and vice versa.

Figure 10:
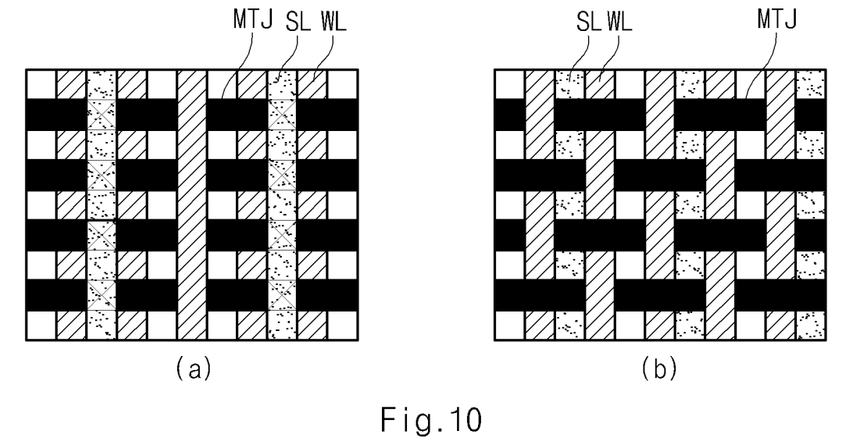
FIG. 10 is a plan view illustrating a method for forming magnetic tunnel junctions (MTJs) according to the present invention.

FIG. 10 is a plan view illustrating a method for forming magnetic tunnel junctions (MTJs). FIG. 10A illustrates the MTJ having an aspect ratio of 1:2. In FIG. 10A, MTJs are arranged in a straight line so that they are symmetrical with respect to the source line (SL). In order to further increase the aspect ratio of 1:2, as shown in FIG. 10B, neighboring MTJs neighboring along the source line (SL) direction may be arranged in a zigzag manner (i.e., staggered), such that they can overlap with the source line (SL). If MTJs are arranged as shown in FIG. 10B, the aspect ratio can be increased, and at the same time a space between MTJs may be equal to that of FIG. 10A, so that the thermal stability of the spin may be greatly improved and the patterning may be facilitated.

Although the MTJ is formed in the shape of a rectangle in FIGS. 10A and 10B, it should be noted that the MTJ is not limited to only the rectangular MTJ and can also be formed as an oval having the aspect ratio (long axis-short axis ratio) of 1:1~1:5 as necessary.

After the MTJ is formed, a third planarized interlayer insulating layer 36 is formed on the MTJ and the second interlayer insulating layer 35. The third interlayer insulating layer 36 is selectively etched until a top electrode of the MTJ (i.e., a free ferromagnetic layer) is exposed, so that a top electrode contact hole (not shown) is formed. In this case, a top electrode contact hole (not shown) may be formed to expose the center part of the MTJ. However, the top electrode contact hole (not shown) is formed at the same position as that of the bottom electrode contact hole (not shown) using a patterning mask that has been used to form a bottom electrode contact hole (not shown). This reduces the number of patterning mask steps. In order to reduce difficulty in a semiconductor fabrication process, a top electrode contact hole (not shown) may be formed at a position where the top electrode contact hole may be regularly connected to the MTJ.

Subsequently, a conductive layer is formed to fill the top electrode contact hole, and is etched until the third interlayer insulating layer 36 is exposed, so that a top electrode contact (TEC) is formed.

The above-mentioned bottom electrode contact (BEC) and top electrode contact (TEC) may be formed of W, Ru, Ta, Cu or a combination thereof.

Figure 9:
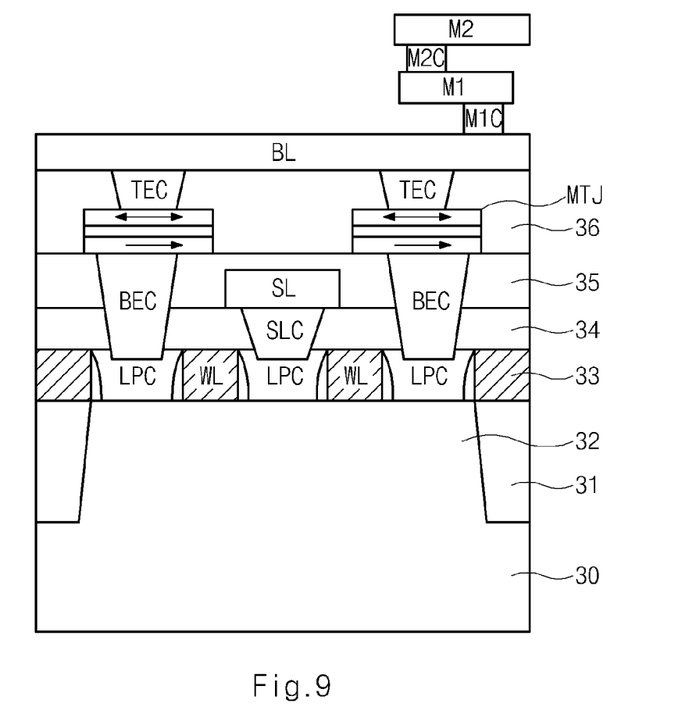

Referring to FIG. 9, after a metal layer (not shown) is formed on the resultant structure of FIG. 8, the metal layer is patterned using a mask (not shown) defining the bit line, so that the bit line (BL) is formed perpendicular to the word line (WL) and the source line (SL).

Next, metal lines M1 and M2 and metal line contacts M1C and M2C are formed on the bit line (BL), so that the bit line (BL) can communicate with the peripheral circuit (not shown) through the metal lines M1 and M2 and the metal line contacts M1C and M2C. A method for forming a metal line connected to the bit line (BL) and subsequent processes may be equal to those of a conventional DRAM.

A method for forming the bottom electrode contact (BEC) illustrated in the above-mentioned embodiment is as follows. That is, after the second interlayer insulating layer 35 is formed, the second interlayer insulating layer 35 and the first interlayer insulating layer 34 are sequentially etched, and a conductive layer is filled into the etched contact hole, so that the bottom electrode contact (BEC) is formed.

However, the above method for forming the bottom electrode contact (BEC) may also be carried out in different ways. For example, after the first interlayer insulating layer 34 is formed, the source line contact hole is formed at the same time a bottom electrode contact (BEC) region is etched to form a first bottom electrode contact hole. Subsequently, the first bottom electrode contact hole is filled with a conductive layer and the conductive layer is then planarized, so that a first bottom electrode contact (BEC) is formed. Thereafter, the second interlayer insulating layer 35 is formed, and the second bottom electrode contact hole connected to the first bottom electrode contact (BEC) is then formed. Subsequently, the second bottom electrode contact hole is filled with a conductive layer and the conductive layer is then planarized, so that not only a first bottom electrode contact (BEC) but also a bottom electrode contact (BEC) connected to the second bottom electrode contact (BEC) is formed. Otherwise, a metal layer may be formed between the first bottom electrode contact (BEC) and the second bottom electrode contact (BEC).

Figure 11:
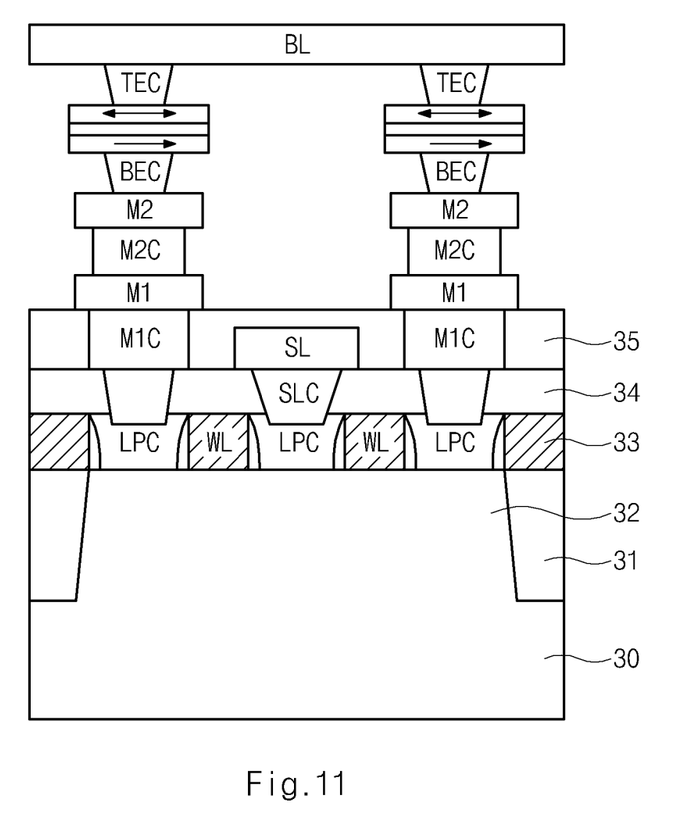
FIG. 11 is a cross-sectional view illustrating a STT-MRAM device according to a second embodiment to which the STT-MRAM cell of FIG. 2 is applied.

FIG. 11 is a cross-sectional view illustrating a STT-MRAM device according to a second embodiment to which the STT-MRAM cell of FIG. 2 is applied according to the present invention.

When comparing the structure of FIG. 11 with that of FIG. 3, metal lines M1 and M2 of FIG. 11 are formed before the bit line (BL) is formed, whereas metal lines M1 and M2 of FIG. 3 are formed after the bit line is formed. In other words, operation characteristics of the MTJ may be affected by a subsequent thermal process, in particular, characteristics of the MTJ may be deteriorated by a high-temperature thermal process of 500° C. or higher. Therefore, the process for forming the metal lines M1 and M2 may be selectively carried out before or after the MTJ forming process.

In this case, as shown in FIG. 11, if a metal process for forming the metal lines is carried out before the MTJ forming process, a source line is formed in the same manner as in FIG. 3. However, the structure of FIG. 11 must further include a process for forming metal line contacts M1C and M2C and metal lines M1 and M2 at a position between the landing plug contact (LPC), that is formed on a non-sharing source/drain region between gates, and the bottom electrode contact (BEC) in the MTJ forming process.

In FIG. 11, the process for forming the metal line contacts M1C and M2C and the metal lines M1 and M2 at a position between the landing plug contact (LPC) and the bottom electrode contact (BEC) may be replaced with any metal-line forming process used in the conventional DRAM without any problems. A detailed description thereof will be omitted herein for convenience of description.

As can be seen from FIG. 11, the process for forming metal lines may be selectively performed before or after the MTJ forming process so as to prevent MTJ characteristics from being deteriorated by a high-temperature thermal process. Although the same reference numbers have been used throughout FIGS. 4 to 9 to refer to the same or like parts for convenience of description, it should be noted that metal lines of FIG. 11 is not always indicative of those of the first embodiment.

As apparent from the above description, as shown in the STT-MRAM device and a method for manufacturing the same according to the present invention, a STT-MRAM cell is formed on the basis of a transistor of a DRAM cell, so that the availability of the STT-MRAM and the degree of integration of the STT-MRAM can be increased.

In addition, a STT-MRAM cell is used in a memory device so as to manufacture a higher-integration MRAM, and uses the STT-MRAM cell based on a transistor of a DRAM cell, resulting in an increase in the availability of the STT-MRAM.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. Magnetic memory device comprising:
   first and second gates formed over a semiconductor substrate;
   a source line connected to a source/drain region shared by the first and second gates;
   a magnetic tunnel junction connected to a source/drain regions provided adjacent to the first gate and not shared by the first and second gates; and
   a bit line electrically coupled to the magnetic tunnel junction.

2. The magnetic memory device according to claim 1, wherein the source line is formed perpendicular to a long axis of an active region.

3. The magnetic memory device according to claim 1, further comprising:
   a first interlayer insulating layer for isolating the first and second gates from the source line, and including a source line contact for connecting the source line to a landing plug contact of the shared source/drain region.

4. The magnetic memory device according to claim 3, further comprising:
   a first bottom electrode contact connected to a landing plug contact of the non-sharing source/drain region.

5. The magnetic memory device according to claim 4, further comprising:
   a second interlayer insulating layer for isolating the source line from the magnetic tunnel junction, and including a second bottom electrode contact for connecting the first bottom electrode contact to the magnetic tunnel junction.

6. The magnetic memory device according to claim 5, further comprising:
   a metal layer to connect the first bottom electrode contact to the second bottom electrode contact.

7. The magnetic memory device according to claim 1, wherein the magnetic tunnel junction has an aspect ratio of 1:1~1:5.

8. The magnetic memory device according to claim 1, wherein the device has a plurality of magnetic tunnel junction that are horizontally symmetrical to each other with respect to the source line.

9. The magnetic memory device according to claim 8, wherein each of the magnetic tunnel junction has an aspect ratio of 1:2.

10. The magnetic memory device according to claim 1, wherein at least some of magnetic tunnel junctions are arranged in a zigzag manner along a source line direction so as to overlap with the source line.

11. The magnetic memory device according to claim 10, wherein each of the magnetic tunnel junctions has an aspect ratio of 1:3.

12. The magnetic memory device according to claim 1, further comprising:
   a metal layer formed between a landing plug contact of the non-sharing source/drain region and the magnetic tunnel junction.

* * * * *